(12) United States Patent
Takazaki

(10) Patent No.: US 9,464,355 B2
(45) Date of Patent: Oct. 11, 2016

(54) COLORED RIGID DECORATIVE MEMBER

(71) Applicants: CITIZEN HOLDINGS CO., LTD., Tokyo (JP); CITIZEN WATCH CO., LTD., Tokyo (JP)

(72) Inventor: Koutarou Takazaki, Saitama (JP)

(73) Assignees: CITIZEN HOLDINGS CO., LTD., Tokyo (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 14/385,165

(22) PCT Filed: Feb. 28, 2013

(86) PCT No.: PCT/JP2013/055475
§ 371 (c)(1),
(2) Date: Sep. 14, 2014

(87) PCT Pub. No.: WO2013/140986
PCT Pub. Date: Sep. 26, 2013

(65) Prior Publication Data
US 2015/0064469 A1 Mar. 5, 2015

(30) Foreign Application Priority Data
Mar. 19, 2012 (JP) ................................. 2012-062471

(51) Int. Cl.
*C23C 14/06* (2006.01)
*C23C 30/00* (2006.01)
(Continued)

(52) U.S. Cl.
CPC ............... *C23C 30/00* (2013.01); *B32B 9/04* (2013.01); *B32B 37/02* (2013.01); *B32B 37/24* (2013.01); *B32B 38/10* (2013.01); *C23C 14/0015* (2013.01); *C23C 14/0084* (2013.01);
(Continued)

(58) Field of Classification Search
USPC ....... 204/192.15, 192.16; 428/336, 697, 698, 428/699
See application file for complete search history.

(56) References Cited

U.S. PATENT DOCUMENTS

| | | | |
|---|---|---|---|
| 9,120,933 B2* | 9/2015 | Takazaki | C23C 14/0015 |
| 2004/0093730 A1* | 5/2004 | Miya | A44C 27/005 |
| | | | 29/896.41 |

FOREIGN PATENT DOCUMENTS

| | | |
|---|---|---|
| JP | S54-85214 A | 7/1979 |
| JP | H03-264400 A | 11/1991 |

(Continued)

OTHER PUBLICATIONS

International Search Report for PCT/JP2013/055475, Apr. 2, 2013.

*Primary Examiner* — Archene Turner

(57) ABSTRACT

Provided is a colored rigid decorative member in which scratch resistance is improved, and deterioration of appearance quality due to a flaw, abrasion, or the like is suppressed, and which has various color variations with a high quality feel. An alloy adhesion layer having a high adhesion effect, an alloy gradient adhesion layer of which the content of a reactant gas is increased in a gradient manner, an abrasion-resistant layer having high hardness, an alloy recolored gradient layer of which the content of a reactant gas is decreased in a gradient manner, and a colored decorative layer having high decorativeness and color variations on the outermost layer are formed on a base using a film with an alloy of a metal having the high effect of adhering to a metal and high brightness (metal having poor corrosion resistance; Mo, W), a metal having high film hardness and high corrosion resistance (metal having poor adhesion; Nb, Ta), and a metal improving corrosion resistance performance (Cr, Ti, Hf, Zr).

11 Claims, 11 Drawing Sheets

(51) Int. Cl.
| | |
|---|---|
| C23C 14/00 | (2006.01) |
| C23C 14/02 | (2006.01) |
| C23C 14/20 | (2006.01) |
| B32B 9/04 | (2006.01) |
| B32B 37/02 | (2006.01) |
| B32B 37/24 | (2006.01) |
| B32B 38/10 | (2006.01) |
| C23C 14/34 | (2006.01) |
| C23C 14/08 | (2006.01) |
| C23C 28/04 | (2006.01) |
| C23C 28/00 | (2006.01) |

(52) U.S. Cl.
CPC ........... *C23C14/025* (2013.01); *C23C 14/027* (2013.01); *C23C 14/06* (2013.01); *C23C 14/083* (2013.01); *C23C 14/20* (2013.01); *C23C 14/34* (2013.01); *C23C 28/042* (2013.01); *C23C 28/048* (2013.01); *C23C 28/322* (2013.01); *C23C 28/341* (2013.01); *C23C 28/343* (2013.01); *C23C 28/345* (2013.01); *C23C 28/36* (2013.01); *B32B 2037/246* (2013.01); *B32B 2310/021* (2013.01); *B32B 2310/0409* (2013.01); *B32B 2311/00* (2013.01); *Y10T 428/30* (2015.01)

(56) References Cited

FOREIGN PATENT DOCUMENTS

| | | |
|---|---|---|
| JP | H08-225944 A | 9/1996 |
| JP | 2004-043959 A | 2/2004 |
| JP | 2006-274444 A | 10/2006 |
| JP | 2007-262472 A | 10/2007 |
| JP | 2010-228307 A | 10/2010 |
| JP | 2011-256424 A | 12/2011 |

* cited by examiner

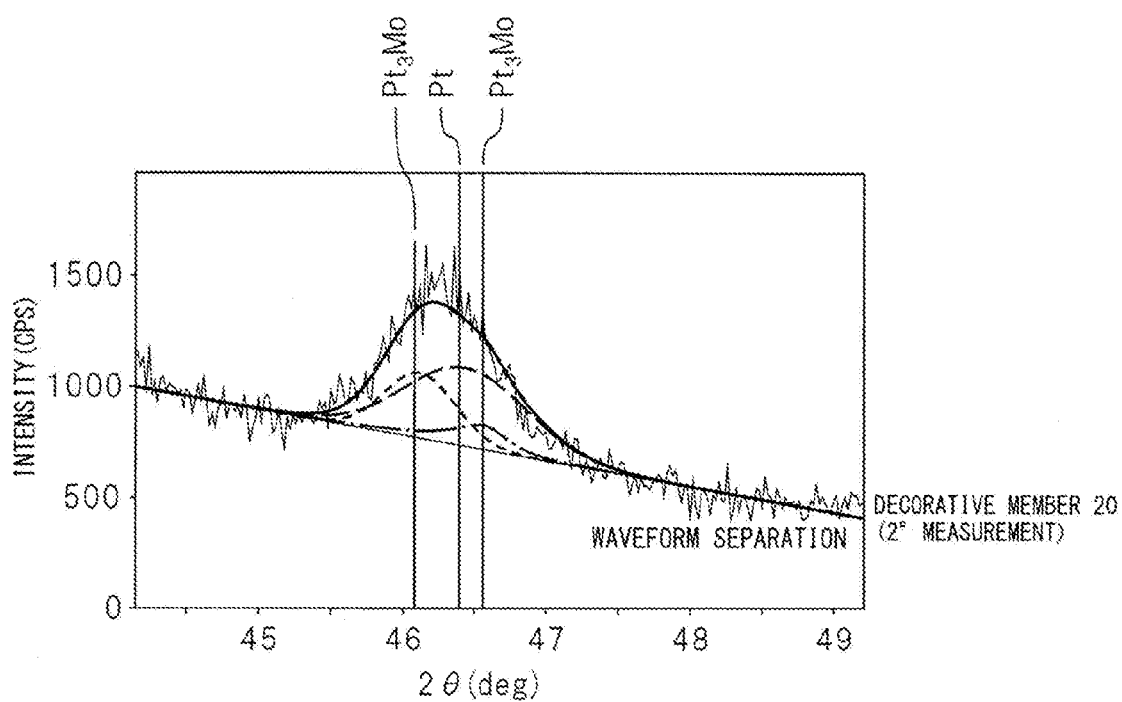
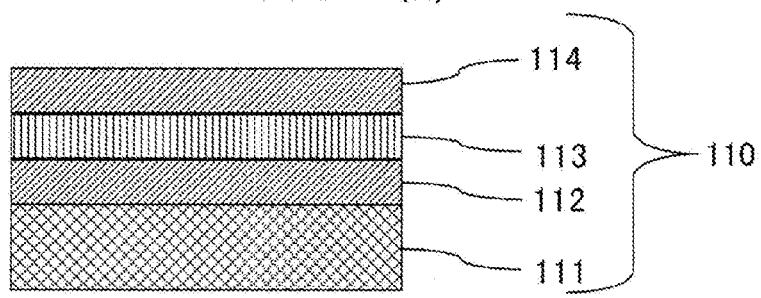
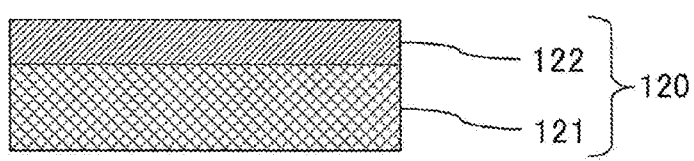

COLORED RIGID DECORATIVE MEMBER

TECHNICAL FIELD

The present invention relates to colored decorative members for exterior parts of watches, personal ornaments such as glasses and accessories, decorative trim, and the like, and particularly relates to a colored rigid decorative member that is rich in various color variations with a high quality feel and is excellent in scratch resistance, abrasion resistance, and an anticorrosion property for a long period.

BACKGROUND ART

A platinum coating having high brightness has been conventionally formed on the outermost layer of an abrasion-resistant layer for improving the scratch resistance of exterior parts, personal ornaments such as glasses, accessories, and watches, decorative trim, sporting goods, and the like so as to have an appearance with a high quality feel. For example, in Patent Literature 1, an undercoat layer is formed on a base, a titanium carbide layer is formed on the surface thereof by a dry coating method, and a decorative coating layer comprising platinum or a platinum alloy formed by a dry coating method is formed on the surface thereof. However, it has been preferable to thinly form the film since the platinum layer as the outermost layer has been expensive; and the titanium carbide layer has been preferably made to have a pale color in order to suppress color change due to peeling of the thin platinum layer. Therefore, the hardness of the titanium carbide layer has been low (about 40%) compared to the hardness of a typical titanium carbide layer, and it has been impossible to obtain sufficient scratch resistance.

Further, when hardness is increased by increasing the amount of carbon allowed to react with the titanium carbide layer in order to improve scratch resistance, a color tone is darkened although the scratch resistance is improved. Further, there is a problem that peeling of a film due to increasing film stress and pitting corrosion in a corrosion resistance test are prone to occur when the film thickness of the titanium carbide layer which is a hardened layer is increased in order to similarly improve scratch resistance. Thus, it has been difficult to form the film having a film thickness of 1.0 μm or more.

Furthermore, it has been proposed to use a Mo coating having good brightness, a good color tone, and a good low-splash property, having scratch resistance, and having a high quality feel instead of the platinum-based coating as the outermost layer. However, there has been a problem that it has been impossible to use the Mo coating without being processed since the Mo coating has had low corrosion resistance. Although it has been proposed to use a Cr coating having good brightness, a good color tone, and a good low-splash property, and having a high quality feel, there has been a problem that the Cr coating has low film hardness, resulting in insufficient scratch resistance, and it has been difficult to peel the Cr coating in a production step since the Cr coating has very high corrosion resistance. On the other hand, it has been proposed to use, as the outermost layer, a Nb carbide film or a Ta carbide film having high hardness and having corrosion resistance. However, there has been a problem that the coatings have low adhesion to a base, low scratch resistance due to the impossibility of allowing a film thickness to be large, and also slightly low brightness, and it has been also impossible to use the coatings without being processed.

In addition, a rigid carbon film (DLC film) described in Patent Literature 3, a dielectric film described in Patent Literature 4, or a method for forming a multi-colored coating having a two-tone color described in Patent Literature 5 have been also proposed in order to obtain an outermost surface having decorativeness with a high quality feel; however there has been a problem that a base substance as a base lacks abrasion resistance and adhesion, has low scratch resistance for a decorative member, is easily flawed, and has a deteriorated appearance.

CITATION LIST

Patent Literature

Patent Literature 1: Japanese Laid-open Patent Publication No. 2004-043959
Patent Literature 2: Japanese Laid-open Patent Publication No. 2007-262472
Patent Literature 3: Japanese Patent Publication No. 08-225944
Patent Literature 4: Japanese Patent Publication No. 2010-228307
Patent Literature 5: Japanese Laid-open Patent Publication No. 3-264400

SUMMARY OF INVENTION

Technical Problem

An object of the present invention is to provide a colored rigid decorative member in which deterioration of appearance quality due to a flaw, abrasion, or the like is suppressed by significantly improving scratch resistance and which has various color variations with a high quality feel.

Solution to Problem

In order to achieve the above-described object, the colored rigid decorative member of the present invention employs configurations described below.

The colored rigid decorative member of the present invention includes, on a base, an adhesion layer including an alloy lower oxide having a high adhesion effect, an alloy compound gradient adhesion layer of which the content of a reactant gas is increased in a gradient manner, an alloy compound abrasion-resistant layer, an alloy compound recolored gradient layer of which the content of a reactant gas is decreased in a gradient manner, and a colored decorative layer.

In the colored rigid decorative member of the present invention, adhesion between the base and the film is significantly improved, and scratch resistance is improved since the colored rigid decorative member includes, on the base, the alloy adhesion layer having a high adhesion effect, the alloy gradient adhesion layer of which the content of a reactant gas is increased in a gradient manner, the abrasion-resistant layer having high hardness, and the alloy recolored gradient layer of which the content of a reactant gas is decreased in a gradient manner, using a film with an alloy of a metal (Mo, W) having the high effect of adhering to a metal and high brightness but having poor corrosion resistance, and a metal (Nb, Ta) having high film hardness and high corrosion resistance but having poor adhesion, and, in addition, as needed, (Cr, Ti, Hf, Zr) improving corrosion resistance performance; scratch resistance can be further improved since the abrasion-resistant layer having high film hardness can be thickly formed; and a colored decorative layer selected from a noble metal film having a white color, a rigid film presenting a gold color, a DLC rigid film having a black color, and a dielectric film having an interference effect is stacked on the whole or a portion of the recolored gradient layer.

Aspects of the present invention are as follows:

(1) A colored rigid decorative member including: a base; an adhesion layer, stacked on the base, including a lower oxide layer of an alloy in which a metal M1 and a metal M2, and, in addition, selectively a metal M3 are combined; a gradient adhesion layer, stacked on the adhesion layer, including a reaction compound of an alloy in which a metal M4 and a metal M5, and, in addition, selectively a metal M6 are combined and of a non-metallic element selected from one or two or more of nitrogen, carbon, and oxygen; an abrasion-resistant layer, stacked on the gradient adhesion layer, including a reaction compound of an alloy in which a metal M7 and a metal M8, and, in addition, selectively a metal M9 are combined and of a non-metallic element selected from one or two or more of nitrogen, carbon, and oxygen; a recolored gradient layer, stacked on the abrasion-resistant layer, including a reaction compound of an alloy in which a metal M10 and a metal M11, and, in addition, selectively a metal M12 are combined and of a non-metallic element selected from one or two or more of nitrogen, carbon, and oxygen; and a colored decorative layer stacked on the recolored gradient layer, wherein each of the metals M1, M4, M7, and M10 is selected from one or two of Mo and W; each of the metals M2, M5, M8, and M11 is selected from one or two of Nb and Ta; the metals M3, M6, M9, and M12 are selected from one or two or more of Cr, Ti, Hf, and Zr; the content of a non-metallic element in a reaction compound included in the gradient adhesion layer is increased in a gradient manner in a thickness direction with departing from a substrate; and the content of a non-metallic element in a reaction compound included in the recolored gradient layer is decreased in a gradient manner in a thickness direction with departing from the substrate.

(2) The colored rigid decorative member according to the above (1), wherein the colored decorative layer is a white noble metal film of Pt, Pd, or Rh; and an intermetallic compound of a metal in the recolored gradient layer and the white noble metal is formed in a boundary between the colored decorative layer and the recolored gradient layer.

(3) The colored rigid decorative member according to the above (1), wherein the colored decorative layer is a rigid film including a nitride, a carbide, a carbonitride, or a nitroxide of Ti, Zr, or Hf.

(4) The colored rigid decorative member according to the above (1), wherein the colored decorative layer is a DLC (diamond-like carbon) rigid film.

(5) The colored rigid decorative member according to the above (1), wherein the colored decorative layer is a dielectric layer obtained by forming a single- or multi-layered dielectric film.

(6) The colored rigid decorative member according to the above (4) or (5), wherein a single- or multi-layered adhesion layer including Si or Ti is formed between the recolored gradient layer and the colored decorative layer.

(7) The colored rigid decorative member according to any of the above (1) to (6), wherein the colored decorative layer includes a two-tone structure.

(8) A method for producing a colored rigid decorative member, including: a step of forming, on a base, an adhesion layer including a lower oxide layer of an alloy in which a metal M1 and a metal M2, and, in addition, selectively a metal M3 are combined; a step of forming, on the adhesion layer, a gradient adhesion layer including a reaction compound of an alloy in which a metal M4 and a metal M5, and, in addition, selectively a metal M6 are combined and of a non-metallic element selected from one or two or more of nitrogen, carbon, and oxygen so that the content of a non-metallic element in a reaction mixture included in the gradient adhesion layer is increased in a gradient manner in a thickness direction with departing from a substrate; a step of forming, on the gradient adhesion layer, an abrasion-resistant layer including a reaction compound of an alloy in which a metal M7 and a metal M8, and, in addition, selectively a metal M9 are combined and of a non-metallic element selected from one or two or more of nitrogen, carbon, and oxygen; a step of forming, on the abrasion-resistant layer, a recolored gradient layer including a reaction compound of an alloy in which a metal M10 and a metal M11, and, in addition, a metal M12 are combined and of a non-metallic element selected from one or two or more of nitrogen, carbon, and oxygen so that the content of a non-metallic element in a reaction compound included in the recolored gradient layer is decreased in a gradient manner in a thickness direction with departing from the substrate; and a step of forming a colored decorative layer on the recolored gradient layer, wherein each of the metals M1, M4, M7, and M10 is selected from one or two of Mo and W; each of the metals M2, M5, M8, and M11 is selected from one or two of Nb and Ta; and each of the metals M3, M6, M9, and M12 is selected from one or two or more of Cr, Ti, and Hf.

(9) The method for producing a colored rigid decorative member according to the above (8), wherein at least one of the adhesion layer, the gradient adhesion layer, the abrasion-resistant layer, the recolored gradient layer, and the colored decorative layer is formed by a reactive sputtering method.

(10) The method for producing a colored rigid decorative member according to the above (9), wherein the gradient adhesion layer is formed by chronologically increasing or decreasing the amount of reactant gas containing the non-metallic element in a reactive sputtering method in the step of forming the gradient adhesion layer; and the recolored gradient layer is formed by chronologically increasing or decreasing the amount of reactant gas containing the non-metallic element in a reactive sputtering method in the step of forming the recolored gradient layer.

(11) The method for producing a colored rigid decorative member according to any one of the above (8) to (10), further including a step of applying a mask to a portion of the colored decorative layer and peeling a non-masked portion of the colored decorative layer with an acid or an alkali, to thereby allow the colored decorative layer to include a two-tone structure.

Advantageous Effects of Invention

In accordance with the present invention, there can be provided a colored rigid decorative member in which deterioration of appearance quality due to a flaw, abrasion, or the like is suppressed and which has various color variations with a high quality feel.

BRIEF DESCRIPTION OF DRAWINGS

FIG. 6(b) represents a view of measurement of the crystallinity of the colored rigid decorative member of Example 1.

FIG. 7(a) illustrates a cross-sectional schematic view of a decorative member of a conventional example (formed by Patent Literature 1) of Example 1.

FIG. 7(b) illustrates a cross-sectional schematic view of a decorative member of a comparative material of Example 1.

DESCRIPTION OF EMBODIMENTS

Embodiments of the present invention will be explained below with reference to the drawings.

<Colored Rigid Decorative Member>

Figure 1:
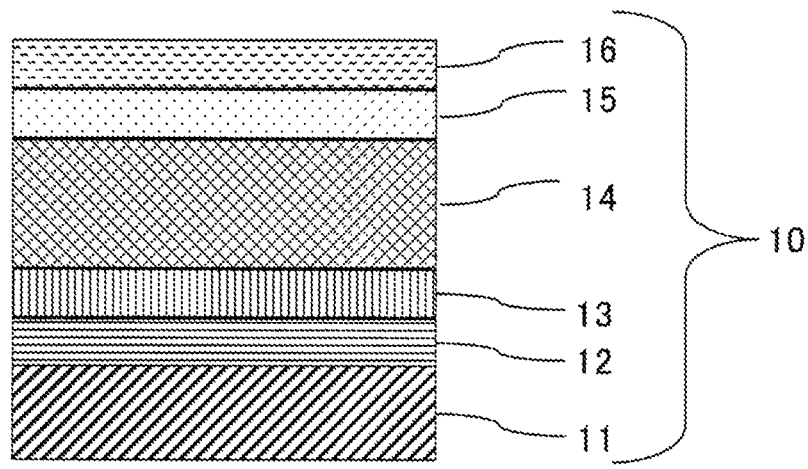
FIG. 1 illustrates a cross-sectional schematic view illustrating one example of the structure of a colored rigid decorative member of the present invention.

FIG. 1 is a cross-sectional schematic view illustrating one example of the structure of the colored rigid decorative member of the present invention. An adhesion layer 12 including a lower oxide of a MoNb alloy is formed on a surface of an SUS316L base 11 as the base, a gradient adhesion layer 13 including a lower oxide of a MoNb alloy in which the content of nitrogen is increased in a gradient manner is formed on the adhesion layer 12, an abrasion-resistant layer 14 of a MoNb alloy nitride layer is formed on the gradient adhesion layer 13, a MoNb alloy recolored gradient layer 15 in which the content of nitrogen is decreased in a gradient manner is formed on the abrasion-resistant layer 14, and a colored decorative layer 16 is formed on the MoNb alloy recolored gradient layer 15.

The colored rigid decorative member of the present invention has a characteristic in that a colored rigid decorative member having high scratch resistance and having various color variations can be made since a decorative film with various colors is formed on an alloy film having high scratch resistance performance.

In the colored rigid decorative member of the present invention, scratch resistance and abrasion resistance are improved since a structure in which a definite interface between the adhesion layer 12 and the gradient adhesion layer 13 is eliminated, high adhesion to the base is secured, and film stress is increased in a gradient manner is made, and the effect of suppressing the generation of a crack due to stress strain and peeling is obtained, and further high scratch resistance performance can be obtained since the abrasion-resistant layer 14 having high film hardness can be thickly formed.

Since the abrasion-resistant layer 14 of the colored rigid decorative member 10 includes a MoNb alloy nitride layer formed at a nitrogen content exhibiting the maximum hardness, and the composite hardness of the whole rigid decorative member can be increased, and high scratch resistance performance can be obtained.

Since the recolored gradient layer 15 of the colored rigid decorative member 10 has a structure in which a nonmetallic element content is decreased from the abrasion-resistant layer 14 in a gradient manner, a color tone is increased from the abrasion-resistant layer in a gradient manner, and a color sense with metallic luster and a high quality feel can be obtained.

As the appearance color of the colored rigid decorative member 10, various color variations can be obtained depending on the colored decorative layer 16. Further, since the colored decorative layer 16 is formed on the alloy member (11-15) having high scratch resistance performance, the colored rigid decorative member that is inhibited from being flawed and has a high quality feel can be obtained.

(Base)

The base 11 is preferably a base formed of a metal or ceramic. Specific examples of metals (including alloys) include stainless steel, titanium, titanium alloy, copper, copper alloy, tungsten, or stainless steel, titanium, and titanium alloy subjected to hardening treatment, and the like. The metals may be used singly or in combination of two or more kinds of metals. Further, the shape of the base 11 is not limited.

(Adhesion Layer)

The adhesion layer 12 is a lower oxide film of an alloy of a metal (M1) selected from one or two of Mo and W, and a metal (M2) selected from one or two of Nb and Ta, or an alloy of the metals and, in addition, a metal (M3) selected from one or two or more of Cr, Ti, Hf, and Zr, and is selected depending on compatibility with a base material quality and an environment in which a coating is used. The adhesion layer 12 includes the lower oxide film of either of the alloys, and may also contain a slight amount of carbon and nitrogen. Further, in the alloy, in addition to the metals M1, M2, and M3, metals such as V, B, Al, Si, Mn, Co, La, Ce, Y, and Sc may be contained at a rate of 5 wt % or less in total in the alloy.

The content of oxygen in the alloy metal lower oxide film of the adhesion layer is desirably 5 to 60 atm %, particularly preferably 5 to 45 atm %, with respect to the metals. The adhesion of the adhesion layer is not different from that of the alloy metal film when the oxygen content is less than 5 atm %, while the adhesion is deteriorated, and scratch resistance is also deteriorated when the oxygen content reaches 60 atm %.

The thickness of the adhesion layer of the alloy lower oxide film is desirably 0.03 to 0.3 µm. In order to obtain the effect of improving the adhesion by the adhesion layer, a thickness of 0.03 µm or more offers the effective effect; and in addition, the adhesion effect is not changed very much even when the thickness is increased to more than 0.3 µm.

(Gradient Adhesion Layer)

The gradient adhesion layer 13 includes a film which is a reaction compound of an alloy of a metal M4 selected from one or two of Mo and W, and a metal M5 selected from one or two of Nb and Ta, or an alloy of the metals and, in addition, a metal M6 selected from one or two or more of Cr, Ti, Hf, and Zr, and of a non-metallic element selected from one or two or more of carbon, nitrogen, and oxygen, and in which the content of the non-metallic element is increased in a gradient manner. The gradient adhesion layer 13 preferably includes a film in which the content of one or more non-metallic elements of carbon, nitrogen, and oxygen is increased in a gradient manner, for example, a carbide film, a nitride film, a carbonitride film, an oxynitride film, an oxycarbide film, an oxynitrocarbide film, or the like. The kinds of materials to be selected are determined by compatibility with the adhesion layer 12 and the abrasion-resistant layer 14, and by an environment in which a coating is used. Further, in the alloy, in addition to the metals M4, M5, and M6, metals such as V, B, Al, Si, Mn, Co, La, Ce, Y, and Sc may be contained at a rate of 5 wt % or less in total in the alloy.

The gradient adhesion layer is a gradient film in which the content of carbon, nitrogen, or oxygen, or one or two or more selected non-metallic elements in the gradient adhesion layer is increased in a gradient manner from 0 to 50 atm % with respect to the alloy metal elements. The gradient adhesion layer preferably contains 5 to 25 atm % of oxygen, and further desirably has a structure in which the content of carbon, nitrogen, or the admixture elements thereof is increased in a gradient manner in a range of 0 to 50 atm %.

The thickness of the gradient adhesion layer is desirably 0.05 to 0.3 µm. In order to obtain the effect of the gradient adhesion layer, a thickness of 0.05 µm or more is needed; and, in addition, the adhesion effect is not increased very much even when the thickness is increased to more than 0.3 µm.

(Abrasion-Resistant Layer)

The abrasion-resistant layer 14 is formed of a reaction compound of an alloy of a metal M7 selected from one or two of Mo and W, and a metal M8 selected from one or two of Nb and Ta, or an alloy of the metals and, in addition, a metal (M9) selected from one or two or more of Cr, Ti, Hf, and Zr, and of a non-metallic element selected from one or two or more of carbon, nitrogen, and oxygen. The kinds of materials to be selected are determined depending on a demanded appearance color and an environment in which a coating is used. Further, in the alloy, in addition to the metals M7, M8, and M9, metals such as V, B, Al, Si, Mn, Co, La, Ce, Y, and Sc may be contained at a rate of 5 wt % or less in total in the alloy.

It is desirable that the content of carbon, nitrogen, or the admixture elements thereof in the abrasion-resistant layer is 5 to 70 atm %.

It is desirable that the thickness of the abrasion-resistant layer is 0.3 to 4 µm, and it is desirable that the hardness is HV2000 or more. Since the scratch resistance performance depends on the approximate film thickness and film hardness of the abrasion-resistant layer, the film thickness and the film hardness are desirably allowed to be as high as possible.

(Recolored Gradient Layer)

The recolored gradient layer 15 is a reaction compound of an alloy of a metal M10 selected from one or two of Mo and W, and a metal M11 selected from one or two of Nb and Ta, or an alloy of the metals and, in addition, a metal M12 selected from one or two or more of Cr, Ti, Hf, and Zr, and of a non-metallic element selected from one or two or more of carbon, nitrogen, and oxygen, and is formed by decreasing the content of the non-metallic element in a gradient manner. For example, the recolored gradient layer 15 includes a carbide film, a nitride film, a carbonitride film, an oxynitride film, an oxycarbide film, an oxynitrocarbide film, or the like. The kinds of materials to be selected are determined by compatibility with the abrasion-resistant layer 14, by a demanded appearance color, and by an environment in which a coating is used. Further, in the alloy, in addition to the metals M10, M11, and M12, metals such as V, B, Al, Si, Mn, Co, La, Ce, Y, and Sc may be contained at a rate of 5 wt % or less in total in the alloy.

The recolored gradient layer is a gradient film in which the content of the non-metallic element, preferably carbon, nitrogen, or the admixture elements thereof, in the recolored gradient layer is decreased in a gradient manner from 50 to 0 atm % with respect to the alloy metal elements.

It is desirable that the thickness of the recolored gradient layer is 0.05 to 0.3 µm. It is impossible to sufficiently recolor the abrasion-resistant layer when the thickness of the recolored gradient layer is 0.05 µm or less. When the thickness is 0.3 µm or more, scratch resistance is deteriorated since the thickness of the recolored gradient layer having low hardness is increased, although the abrasion-resistant layer can be sufficiently recolored.

(Colored Decorative Layer)

The colored decorative layer 16 is produced by forming a dielectric layer including a single layer or multi-layers of a white noble metal film of Pt, Pd, Rh, or the like having higher brightness, a metal nitride film of TiN, ZrN, HfN, or the like presenting a gold color, a metal carbonitride film or metal oxynitride film of TiCN, ZrCN, HfCN, TiON, ZrON, HfON, or the like presenting a pink color to a brown color, a DLC (diamond-like carbon) film presenting a black color, or a dielectric film capable of making various colors by an interference effect, into the entirety or a portion (two-tone structure) of the recolored gradient layer.

It is desirable that the film thickness of the white noble metal included in the colored decorative layer is 0.02 to 0.2 µm. It is impossible to sufficiently increase the brightness of the recolored gradient layer when the thickness is 0.02 µm or less. When the thickness is 0.2 µm or more, the scratch resistance performance is deteriorated since the thickness of a noble metal layer having low hardness is increased, although the brightness of the recolored gradient layer can be sufficiently increased.

A rigid film including nitrogen, nitrogen and carbon, or nitrogen and oxygen of Ti, Zr, or Hf included in the colored decorative layer presents a gold color, a pink color, or a brown color depending on the composition. The thickness of the film is desirably 0.05 μm or more; and when the thickness is 0.05 μm or less, it is impossible to sufficiently cover the color tone of the recolored gradient layer presenting a white color. Further, the white color of an undercoat is seen when abrasion is allowed to occur.

The DLC (diamond-like carbon) film included in the colored decorative layer presents a black color. The thickness of the film is desirably 0.05 μm or more. When the thickness is 0.05 μm or less, it is impossible to sufficiently cover the color tone of the recolored gradient layer presenting a white color. Further, the white color of the undercoat is seen when abrasion is allowed to occur.

Further, the formation of a single- or multi-layered adhesion layer including Si or Ti between the DLC film and the recolored gradient layer is preferred for enhancing the adhesion between the DLC film and the recolored gradient layer.

The dielectric layer included in the colored decorative layer is capable of making various colors by an interference effect, and can be designed and controlled by a widely known dielectric multilayer film interference design technology. A decorative member having translucency, high color saturation, and various color tones can be obtained by forming a dielectric film with a single layer or plural layers. The reflected color and color saturation of the dielectric multilayer film are freely adjusted by design. Further, the film in which the refractive index and extinction coefficient of the dielectric layer are high is selected, whereby the design obtained by the dielectric multilayer film interference design technology can be produced with good reproducibility regardless of the color tone of the rigid coating, and change in color tone depending on an incidence angle can be suppressed.

Examples of materials included in the dielectric layer include:

oxides, nitrides, carbides, carbonitrides, and oxynitrides of Si;
oxides, nitrides, oxynitrides, and fluorides of Al;
oxides and sulfides of Zn;
oxides and fluorides of Ce and La;
oxides of Ti, Zr, and Hf;
oxides of Cr and Bi;
oxides of V, Nb, and Ta;
oxides and fluorides of Y;
oxides and fluorides of Mg and Ca, fluorides of Ba;
oxides and fluorides of Li;
fluorides of K;
fluorides of Na ($Na_5Al_3F_{14}$, $Na_3AlF_6$, NaF);
ITO films; and the like.

The kinds of stacked materials, the thicknesses of the materials, and the order of stacking the materials can be determined depending on necessary properties.

The total film thickness of the dielectric layer is desirably 0.05 μm or more. When the thickness is 0.05 μm or less, it is impossible to sufficiently cover the color tone of the recolored gradient layer presenting a white color. Further, the white color of the undercoat is seen when abrasion is allowed to occur.

Further, the formation of a single- or multi-layered adhesion layer including Si or Ti between the dielectric layer and the recolored gradient layer is preferred for enhancing the adhesion between the dielectric layer and the recolored gradient layer.

Since the dielectric layer is formed on the outermost surface, it is desirable to form the dielectric film having hardness that is as high as possible on the outermost layer. Examples of the outermost layer include nitrides, carbonitrides, and oxynitrides of Si; oxides, nitrides, and oxynitrides of Al; and the like.

(Production Method)

Each stacked layer included in the colored rigid decorative member of the present invention can be formed by a sputtering method, a CVD method, an ion plating method, or the like, and is preferably formed by a reactive sputtering method.

The colored rigid decorative member 10 of an embodiment of the present invention can be produced by the reactive sputtering method. The sputtering method is a method in which a high voltage with a direct current or an alternating current is applied between targets including atoms included in the base and the coating while introducing an inert gas (mainly an Ar gas) into a chamber evacuated to a vacuum, and ionized Ar is allowed to collide with the targets to form a thrown-up target substance on the base. A slight amount of reactive gas is introduced with the inert gas, whereby a compound coating of the atoms included in the targets and the reactive gas can be formed on the base. The decorative member 10 of the embodiment is produced by controlling adhesion, film hardness, and a color tone by selecting the atoms included in the targets and the reactive gas and adjusting the amounts thereof.

The reactive sputtering method has high controllability of film quality and a film thickness, and is easily automated. Further, since sputtered atoms have high energy, the heating of the base for improving adhesion is not needed, and a film can be formed even on a base such as plastic having a low melting point. Further, because of the method in which the thrown-up target substance is formed on the base, film formation even with a high-melting-point material is possible, and a material is freely selected. Furthermore, a carbide film, a nitride film, a carbonitride film, an oxynitride film, an oxycarbide film, an oxynitrocarbide film, or the like can be easily formed by selecting or mixing reactive gases. Alloying of the atoms included in the targets also enables the formation of an alloy coating, and the formation of the carbide film, nitride film, carbonitride film, oxynitride film, oxycarbide film, oxynitrocarbide film, or the like of an alloy.

The gradient adhesion layer 13 and the recolored gradient layer 15 in the colored rigid decorative member 10 of the embodiment of the present invention are formed by chronologically increasing or decreasing the amount of a selected reactive gas. The amount of the reactive gas is controlled by an automatically controlled mass flow controller, and the color tones and hardnesses of the layers can be controlled by the amount of the reactive gas.

In accordance with an embodiment of the present invention, the colored decorative layer on the outermost surface can be allowed to have a so-called two-tone structure having a two-tone color. The two-tone structure can be formed by a known method. A method for obtaining a two-tone structure generally includes a step of applying a mask to a portion of the colored decorative layer, a step of peeling a non-masked colored decorative layer with an acid such as hot nitric acid, a step of peeling the mask, and a step of performing reduction removal of an oxide film formed on a film having acid resistance by acid peeling. The reduction treatment is a step of removing the oxide film on the surface, for example, with a thiourea-based treatment agent. For the peeling of the colored decoration film, not only the acid but also a peeling liquid suitable for each material can be used and is selected in relation to the corrosion resistance of a rigid member to be an undercoat.

By allowing the colored decorative layer to have the two-tone structure, a rigid gold-colored film formed of, for example, TiN, ZrN, or the like, can be made to be a multi-colored coating, and a high quality feel with more decorativeness can be obtained. The two-tone structure can be applied not only to rigid films but also to any other colored decorative layers such as white noble metal films, DLC rigid films, and dielectric films.

Since the present invention can provide a colored rigid decorative member having a color tone with a high quality feel, the present invention can be utilized in decorative members for exterior parts of watches, personal ornaments such as glasses and accessories, decorative trims, sporting goods, and the like. In the case of a watch, the colored rigid decorative member mentioned above can be applied to some of parts included in the watch, for example, exterior parts. The watch may be any of photovoltaic watches, thermo electric generating watches, standard time radio wave reception type self-correction watches, mechanical watches, and general electronic watches. Such a watch is produced by a known method using the colored rigid decorative member. The watch is one example of a decorative member that is easily flawed by friction by a shirt or by collision with a desk, a wall, or the like. The colored rigid decorative member of the present invention is formed into the watch, whereby a state in which a flaw is inhibited for many years and an appearance is very beautiful can be maintained. For example, the rigid decorative member mentioned above can be used in the bezel, lug, case, crown, push button, band, and the like of the watch.

EXAMPLES

The properties of the colored rigid decorative member of the present invention will be explained in detail below based on examples. Scratch resistance and reflectance properties were evaluated in the examples, and a method for testing each property is as follows.

<Method for Testing Scratch Resistance>

A scratch resistance test is carried out as follows. A decorative film is applied to an SUS316L base specified by JIS, and abrasion paper in which alumina particles are homogeneously dispersed is brought into contact with a test sample at a certain load, and is rubbed therewith the certain number of times, whereby flaws are generated. The surface of the flawed test sample was scanned in the direction orthogonal to the direction of the flaws to measure surface roughness, and the scratch resistance was evaluated as average root-mean-square roughness. Since the numerical value of the average root-mean-square roughness is increased with increasing the amount of the generated flaws or with increasing the depths of the flaws while the numerical value of the average root-mean-square roughness is conversely decreased with decreasing the amount of the generated flaws or with decreasing the depths of the flaws, the scratch resistance can be numerically evaluated by the scratch resistance test.

<Method for Measuring Film Harness>

The measurement of film harness was performed using a micro indentation hardness tester (H100 manufactured by FISCHER). A Vickers indenter was used for a gauge head. The Vickers indenter was inserted at a load of 5 mN into a sample, retained for 10 seconds, and thereafter unloaded, and the film hardness was calculated from the depth of an indentation formed by the insertion of the Vickers indenter.

<Method for Measuring Color Tone>

The color tone (brightness, color saturation) of the decorative member was measured using Apectra Magic NX manufactured by KNICA MINOLTA. The L*a*b* of each film was measured with an L*a*b* chromaticity diagram using a light source D65 to measure brightness L*.

Example 1

Figure 2:
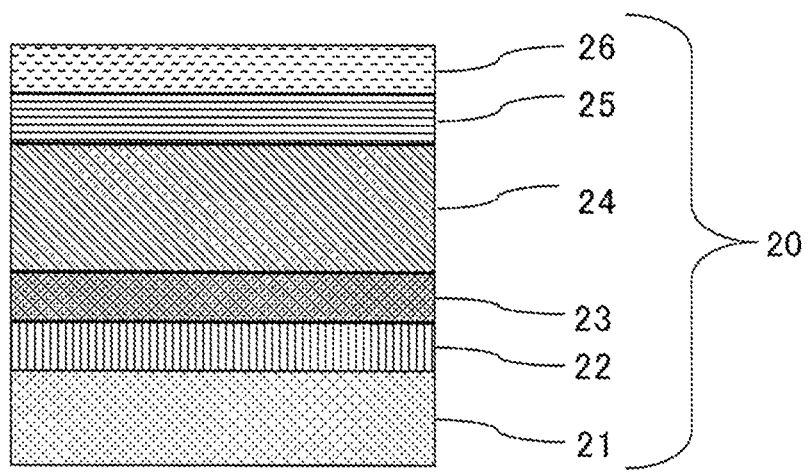
FIG. 2 illustrates a cross-sectional schematic view of a colored rigid decorative member of Example 1.

A sintered body of 45 wt % Mo and 55 wt % Nb and a metal Pt target were used as sputtering targets in Example 1. As illustrated in FIG. 2, an SUS316L material specified by JIS was used as a base 21, and an adhesion layer 22 of 0.1 μm including a lower oxide of a MoNb alloy was formed on the base 21 by a sputtering method. Then, a methane gas was increased in a gradient manner while introducing the minute amount of oxygen gas, whereby a gradient adhesion layer 23 with a MoNb alloy oxycarbide film of 0.2 μm was formed. Thereafter, a thin-film abrasion-resistant layer 24 including a MoNb alloy carbide film of 2.2 μm was formed. Furthermore, a methane gas was decreased in a gradient manner, whereby a recolored gradient layer 25 with a MoNb alloy carbide film of 0.1 μm was formed. Thereafter, a methane gas was stopped, only an argon gas was allowed to flow, and a Pt film of 0.05 μm was formed to produce a colored rigid decorative member 20.

Figure 3:
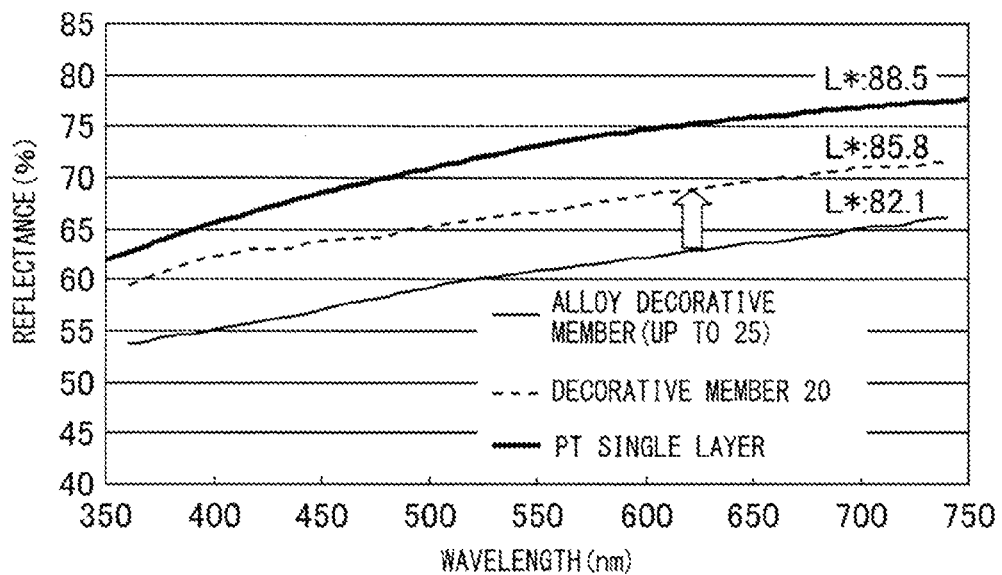
FIG. 3 represents the reflectance properties of the colored rigid decorative member of Example 1 and comparative materials.

FIG. 3 is a comparative view of comparison of the reflectance properties of the colored rigid decorative member 20 obtained in the present Example 1 and a rigid decorative member including stacked bodies 21 to 25 without forming a Pt layer 26 in a structure similar to that of the colored rigid decorative member (hereinafter referred to as an alloy decorative member). The appearance color of the colored rigid decorative member 20 in Lab color space displaying exhibited L*: 85.8, a*: 0.81, and b*: 3.48, and the colored rigid decorative member 20 had markedly high brightness compared to the alloy decorative member in which no Pt layer was formed, and further exhibited higher brightness than that in the colored appearance of the SUS316L base 21, exhibiting L*: 85.1, a*: 0.38, and b*: 2.34.

Figure 4:
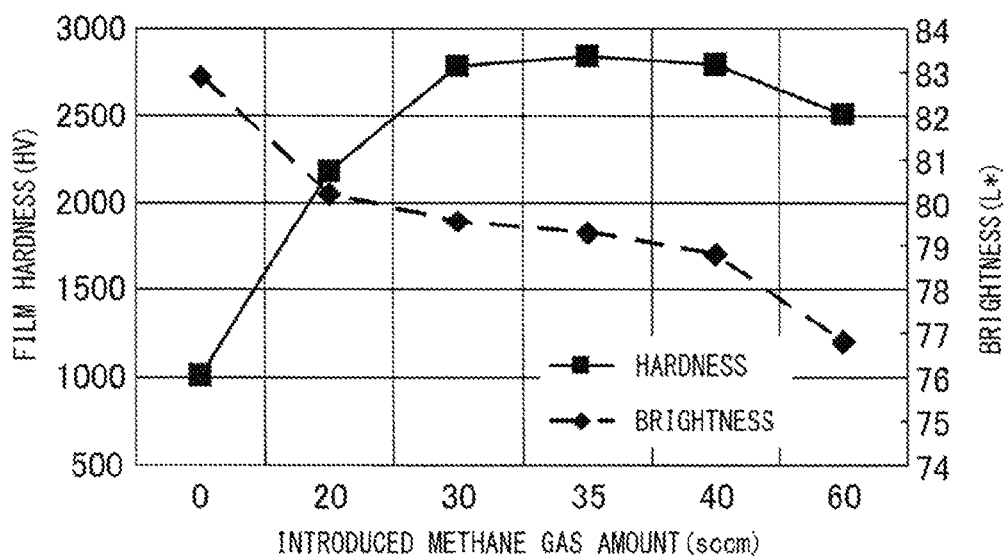
FIG. 4 represents changes in the hardness and brightness of the colored rigid decorative member of Example 1 in a case in which the amount of methane gas is changed.

FIG. 4 is a view representing changes in hardness and brightness in a case in which the amount of introduced methane gas was changed under a constant Ar gas amount of 105 sccm in the colored rigid decorative member 20 of Example 1. The change in the film hardness had a peak, and the brightness was gently decreased with increasing the amount of the introduced methane gas. As the adhesion layer 22 in the colored rigid decorative member 20, a MoNb lower oxide film of 0.1 μm was formed by introducing 5 sccm of oxygen gas under the condition of a methane gas introduction amount of 0 sccm in FIG. 3. The used of MoNb lower oxide for the adhesion layer 22 results in the higher adhesion to the base than that of the MoNb alloy film, whereby scratch resistance can be improved. A MoNb alloy carbide film of 0.2 μm was formed as the gradient adhesion layer 23 by increasing, in a gradient manner, the amount of the introduced methane gas in FIG. 3 from 0 sccm to 35 sccm exhibiting the maximum hardness while introducing 3 sccm of oxygen gas. A MoNb alloy carbide film of 2.2 μm was formed as the abrasion-resistant layer 24 under the condition of an introduced methane gas amount of 35 sccm exhibiting the maximum hardness. A MoNb alloy carbide film of 0.2 μm with an introduced methane gas amount decreased in a gradient manner from an introduced methane gas amount of 35 sccm, exhibiting the maximum hardness in FIG. 3, to 0 sccm was formed as the recolored gradient layer 25.

Figure 5:
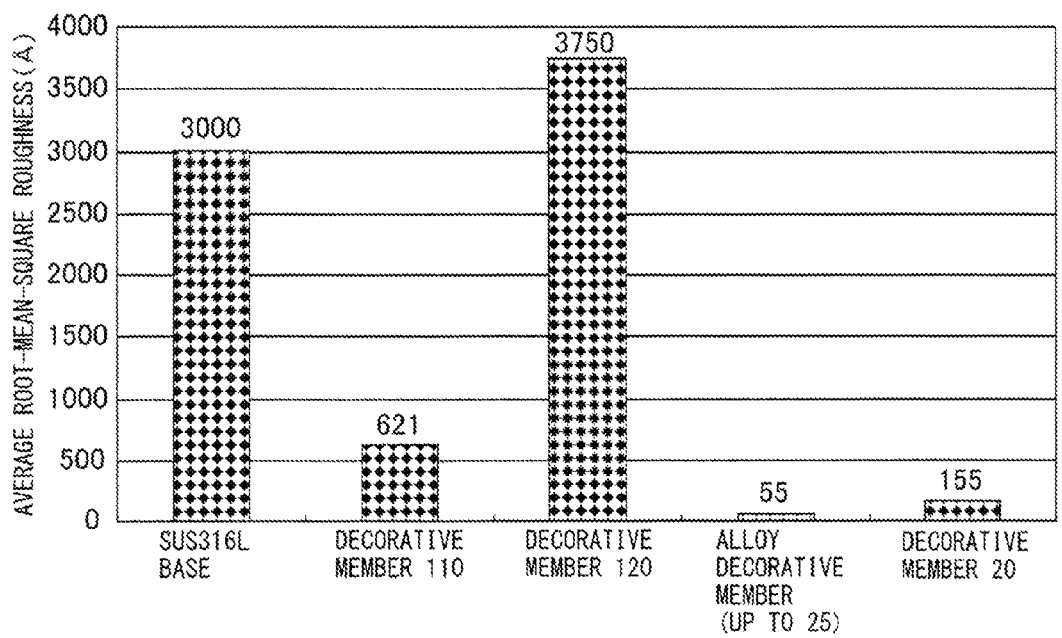
FIG. 5 represents the scratch resistances of the colored rigid decorative member and comparative materials of Example 1.

FIG. 5 is a view representing the results of the measurement of scratch resistance performance in the colored rigid decorative member 20 of Example 1. The scratch resistances (average root-mean-square roughnesses) of the colored rigid decorative member 20 of Example 1 according to the present invention as well as a decorative member 110 illustrated in FIG. 7(a) and produced based on Patent Literature 1, a decorative member 120 illustrated in FIG. 7(b) and obtained by forming a Pt single film 122 on a base, and an SUS316L base, on which no rigid film was formed, as comparative materials, were measured. It was confirmed from FIG. 5 that the white rigid decorative member 20 of Example 1 of the present invention had far better scratch resistance performance than those of the SUS316L base, on which no rigid film was formed, and the decorative member 110 illustrated FIG. 7 and produced based on Patent Literature 1.

Figure 6A:
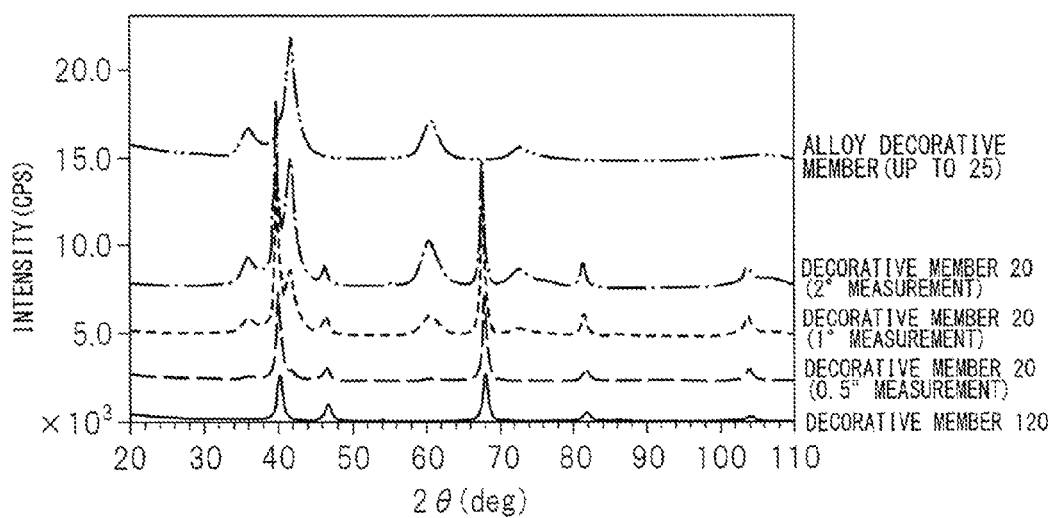
FIG. 6(a) represents a view of measurement of the crystallinity of the colored rigid decorative member of Example 1.

FIGS. 6(a) and (b) are views representing the results of the measurement of the crystallinity of the colored rigid decorative member 20 illustrated in FIG. 2 by X-ray diffraction. The measurement of the crystallinity revealed that $Pt_3Mo$ which was an intermetallic compound of Pt and Mo was formed between the Pt film and the alloy film. It is presumed that the presence of the intermetallic compound results in more adhesion between the alloy film and the Pt film become firm, whereby peeling or the like does not occur at all even when a scratch resistance test is conducted. Therefore, the scratch resistance of the colored rigid decorative member 20 is presumed to be high compared to the decorative member 120 illustrated in FIG. 7(b) and obtained by forming only the soft Pt film on the SUS316L base.

Example 2

Figure 8:
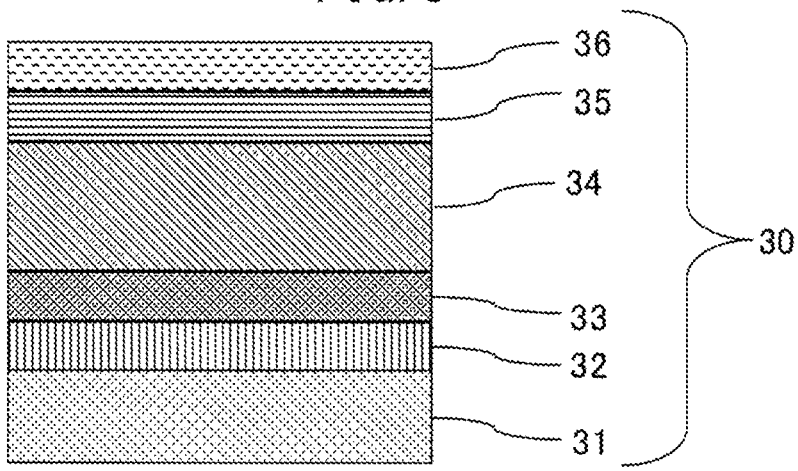
FIG. 8 illustrates a cross-sectional schematic view of a colored rigid decorative member of Example 2.

A sintered body of 30 wt % Mo and 70 wt % Ta and a metal Ti target were used as sputtering targets in Example 2. As illustrated in FIG. 8, an SUS316L material specified by JIS was used as a base 31, and an adhesion layer 32 of 0.1 μm including a lower oxide of a MoTa alloy was formed on the base 31 by a sputtering method. Thereafter, a methane gas was increased in a gradient manner while introducing the minute amount of oxygen gas, whereby a gradient adhesion layer 33 with a MoTa alloy oxycarbide film of 0.2 μm was formed. Thereafter, a thin-film abrasion-resistant layer 34 including a MoTa alloy carbide film of 2.0 μm was formed. Thereafter, a methane gas was decreased in a gradient manner, whereby a recolored gradient layer 35 with a MoTa alloy carbide film of 0.1 μm was formed. Thereafter, the sputtering of the MoTa alloy was stopped, the Ti target was allowed to discharge electricity while introducing an argon gas and a nitrogen gas, and a TiN film 36 of 0.2 μm was formed to produce a colored rigid decorative member 30. The appearance color of the colored rigid decorative member 30 obtained in the present Example 2 in Lab color space displaying exhibited L*: 77.85, a*: 3.92, and b*: 37.18, and the colored rigid decorative member 30 presented a gold color.

Figure 9:
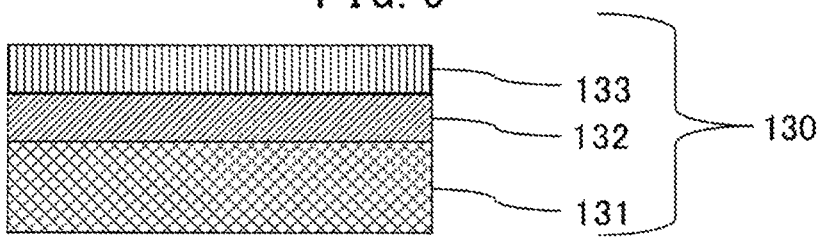
FIG. 9 illustrates a cross-sectional schematic view of a decorative member which is a comparative material of Example 2.
Figure 10:
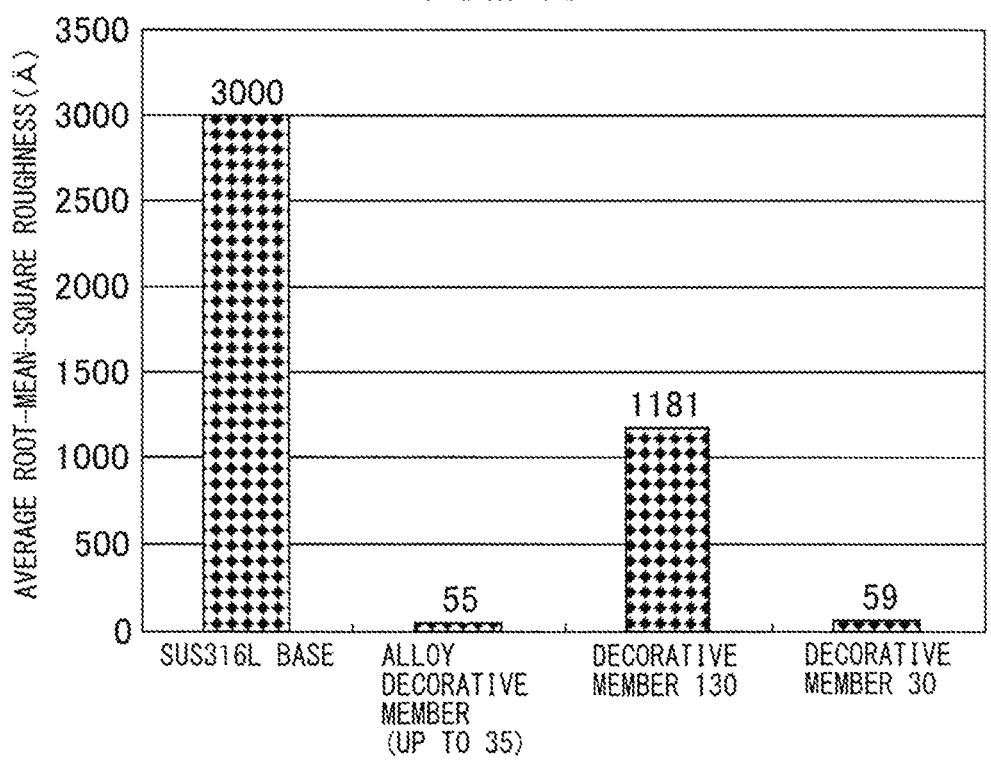
FIG. 10 represents the scratch resistances of the colored rigid decorative member and comparative materials of Example 2.

FIG. 10 is a view representing the results of the measurement of scratch resistance performance in the colored rigid decorative member 30 of Example 2. The scratch resistances (average root-mean-square roughnesses) of the colored rigid decorative member 30 of Example 2 according to the present invention as well as a decorative member 130 produced by forming a Ti film 132 of 0.1 μm on an SUS316L material illustrated in FIG. 9 and specified by JIS and further forming a TiN film 133 of 0.2 μm thereon, an SUS316L base, on which no rigid film was formed, and an alloy decorative member (up to 35) in which the TiN film 36 was not formed in the decorative member 30, as comparative materials, were measured. It was confirmed from FIG. 10 that the colored rigid decorative member 30 of Example 2 of the present invention had far better scratch resistance performance than those of the SUS316L base, on which no rigid film was formed, and the decorative member 130. Further, the scratch resistance performance of the colored rigid decorative member 30 of Example 2 of the present invention is not generally inferior to that of the alloy decorative member (up to 35).

Since the scratch resistance performance is determined generally by the product of the hardness of the abrasion-resistant layer, the film thickness of the abrasion-resistant layer, the degree of adhesion to the base, and the hardness of the base, a rigid member having high scratch resistance performance and presenting a gold color can be formed by forming a TiN film with high adhesion on an alloy film having high scratch resistance performance.

Example 3

Figure 11:
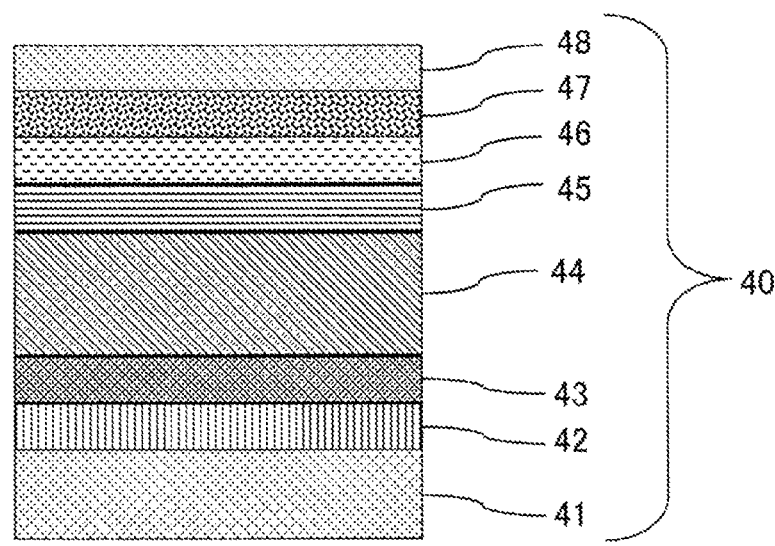
FIG. 11 illustrates a cross-sectional schematic view of a colored rigid decorative member of Example 3.

A sintered body of 60 wt % Mo, 30 wt % Nb, and 10 wt % Cr and metal Ti and metal Si targets were used as sputtering targets in Example 3. As illustrated in FIG. 11, an SUS316L material specified by JIS was used as a base 41, and an adhesion layer 42 of 0.1 μm including a lower oxide of a MoNbCr alloy was formed on the base 41 by a sputtering method. Thereafter, a methane gas was increased in a gradient manner while introducing the minute amount of oxygen gas, whereby a gradient adhesion layer 43 with a MoNbCr alloy oxycarbide film of 0.2 μm was formed. Thereafter, a thin-film abrasion-resistant layer 44 including a MoNbCr alloy carbide film of 2.2 μm was formed. Thereafter, a methane gas was decreased in a gradient manner, whereby a recolored gradient layer 45 with a MoNbCr alloy carbide film of 0.1 μm was formed. Thereafter, the sputtering of the MoNbCr alloy was stopped, the Ti target was allowed to discharge electricity while introducing an argon gas, a Ti film 46 of 0.05 μm was formed, thereafter, the sputtering of the Ti target was stopped, and a Si film 47 of 0.1 μm was formed while introducing an argon gas. Furthermore, thereafter, the sputtering was stopped, and a DLC film 48 of 0.7 μm was formed by a plasma CVD method with introduction of a methane gas to produce a colored rigid decorative member 40. The appearance color of the colored rigid decorative member 40 obtained in the present Example 3 in Lab color space displaying exhibited L*: 48.75, a*: 0.26, and b*: 1.8, and the colored rigid decorative member 40 presented a black color.

Figure 12:
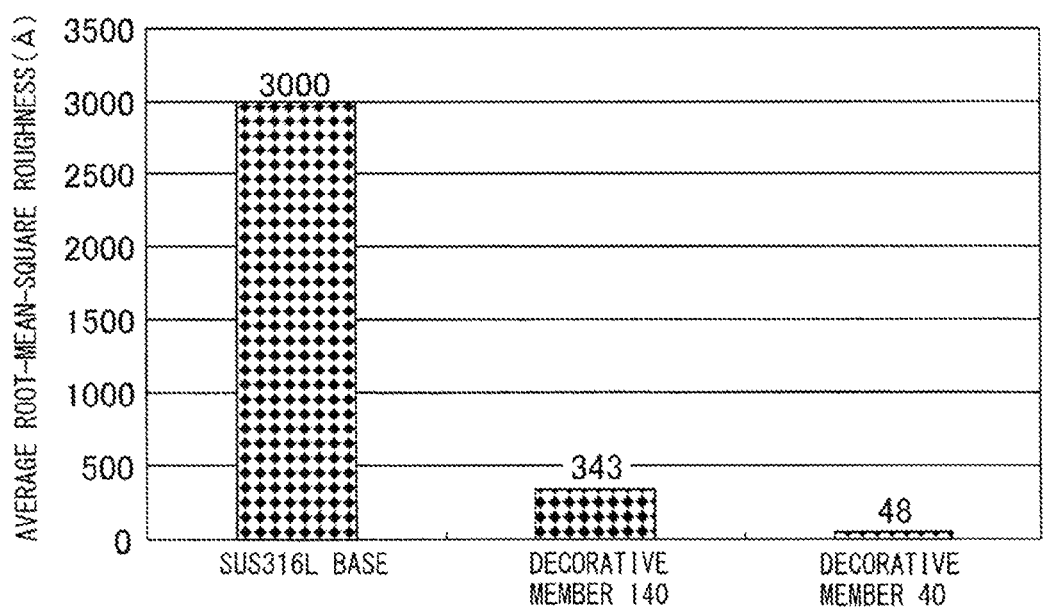
FIG. 12 represents the scratch resistances of the colored rigid decorative member and comparative materials of Example 3.
Figure 13:
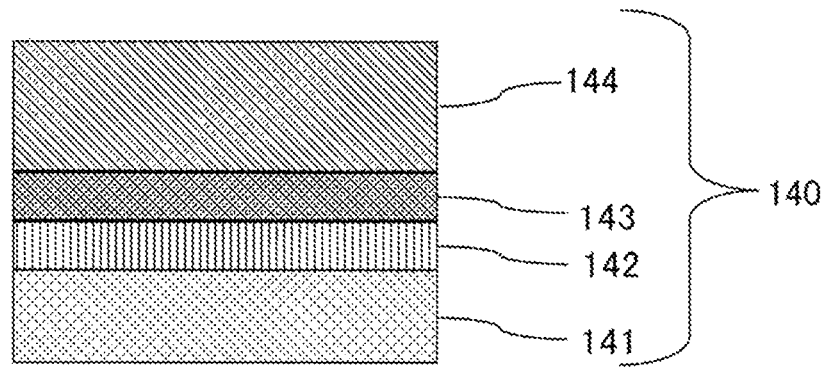
FIG. 13 illustrates a cross-sectional schematic view of a comparative material of Example 4.

FIG. 12 is a view representing the results of the measurement of scratch resistance performance in the colored rigid decorative member 40 of Example 3. The scratch resistances (average root-mean-square roughnesses) of the colored rigid decorative member 40 of Example 3 according to the present invention as well as a decorative member 140 produced by forming a Ti film 142 (thickness: 0.05 μm), a Si film 143 (thickness: 0.1 μm) and a DLC film 144 (thickness: 0.7 μm) on an SUS316L material illustrated in FIG. 13 and specified by JIS, and an SUS316L base, on which no rigid film was formed, as comparative materials, were measured. It was confirmed from FIG. 12 that the colored rigid decorative member 40 of Example 3 of the present invention had far better scratch resistance performance than those of the SUS316L base, on which no rigid film was formed, and the decorative member 140.

Since the scratch resistance performance is determined generally by the product of the hardness of the abrasion-resistant layer, the film thickness of the abrasion-resistant layer, the degree of adhesion to the base, and the hardness of the base, a rigid member having high scratch resistance performance and presenting a black color can be formed by forming a DLC film with high adhesion on an alloy film having high scratch resistance performance.

Example 4

Figure 14:
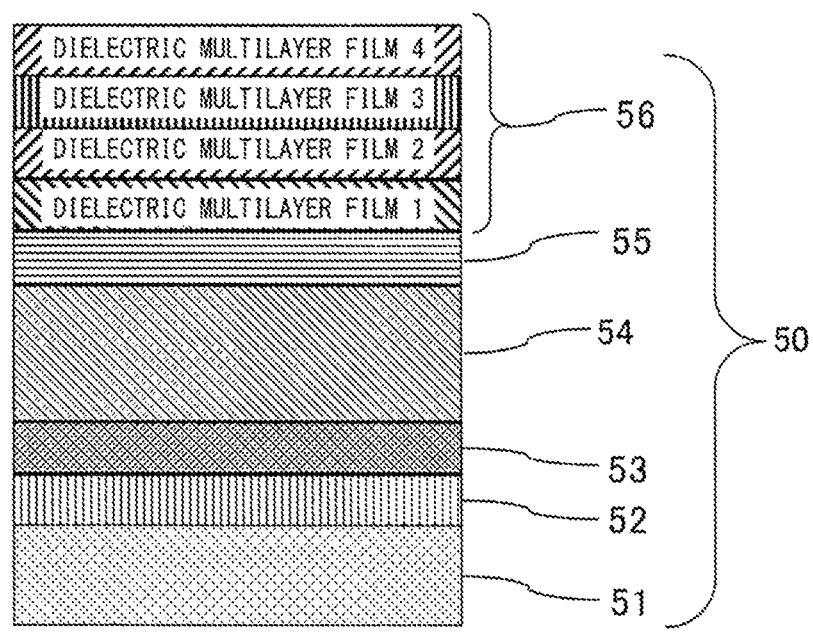
FIG. 14 illustrates a cross-sectional schematic view of a colored rigid decorative member of Example 4.

A sintered body of 45 wt % Mo and 55 wt % Nb and a metal Si target were used as sputtering targets in Example 4. As illustrated in FIG. 14, an SUS316L material specified by JIS was used as a base 51, and an adhesion layer 52 of 0.1 μm including a lower oxide of a MoNb alloy was formed on the base 51 by a sputtering method. Thereafter, a methane gas was increased in a gradient manner while introducing the minute amount of oxygen gas, whereby a gradient adhesion layer 53 with a MoNb alloy oxycarbide film of 0.2 μm was formed. Thereafter, a thin-film abrasion-resistant layer 54 including a MoNb alloy carbide film of 2.2 μm was formed. Thereafter, a methane gas was decreased in a gradient manner, whereby a recolored gradient layer 55 with a MoNb alloy carbide film of 0.1 μm was formed. Thereafter, the sputtering of the MoNb alloy was stopped, the Si target was allowed to discharge electricity while introducing an argon gas, and a Si film of 0.072 μm, of which the film thickness was controlled, was formed. Thereafter, dielectric multilayer films 56 including three layers obtained by stacking, on the Si film, a $Si_3N_4$ film (thickness: 0.07 μm), a $SiO_2$ film (thickness: 0.061 μm), and a $Si_3N_4$ film (thickness: 0.03 μm) of which the film thicknesses were controlled were stacked and formed to produce a colored rigid decorative member 50. The appearance color of the colored rigid decorative member 50 obtained in the present Example 4 in Lab color space displaying exhibited L*: 64.18, a*: 38.03, and b*: 5.19, and the colored rigid decorative member 50 presented a vivid red color.

Figure 15:
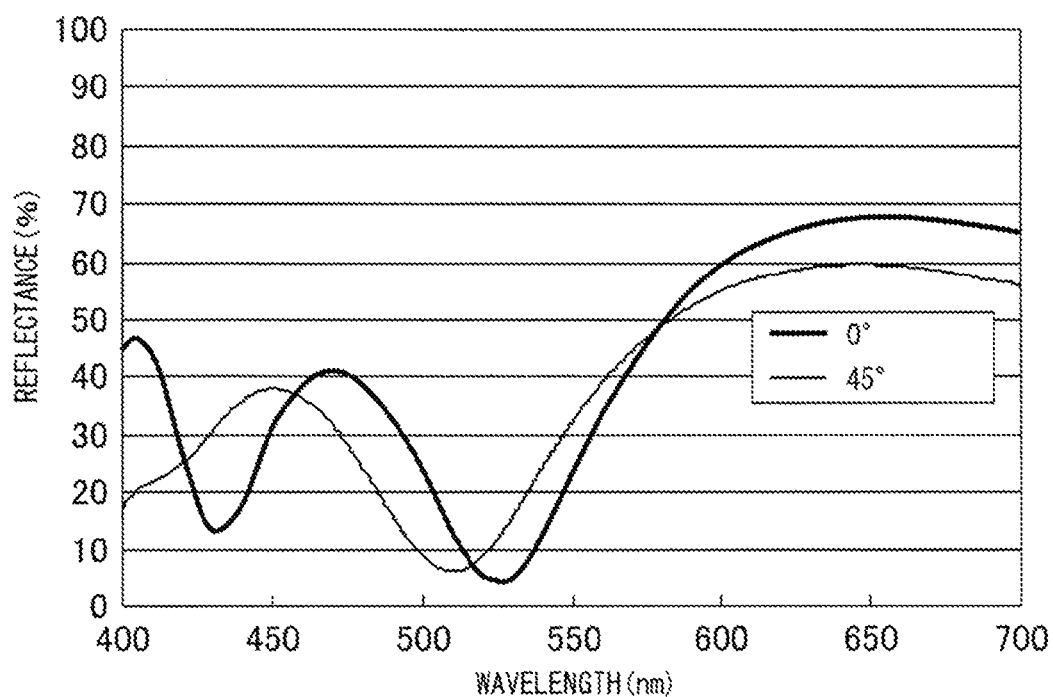
FIG. 15 represents the reflectance properties of the colored rigid decorative member of Example 4 according to an incidence angle.

FIG. 15 is a view representing the reflectance properties according to an incidence angle on the decorative member 50 of Example 4. As a whole, the reflectance of the decorative member 50 is high and the reflectance little varies depending on the variation of the incidence angle. Accordingly, the decorative member 50 of Example 4 had high color saturation and was brightly colored due to the stacking of the dielectric multilayer films 56, compared to the case of the formation with the single layer. Further, a color tone is changed depending on the incidence angle in the single layer, whereas the change of a color tone depending on the incidence angle can be inhibited by the stacking of the dielectric multilayer films 56. Furthermore, the change of a color tone depending on the incidence angle can be allowed to be very small by forming a Si film having a high absorption coefficient as an adhesion layer on the dielectric multilayer films 56.

Figure 16:
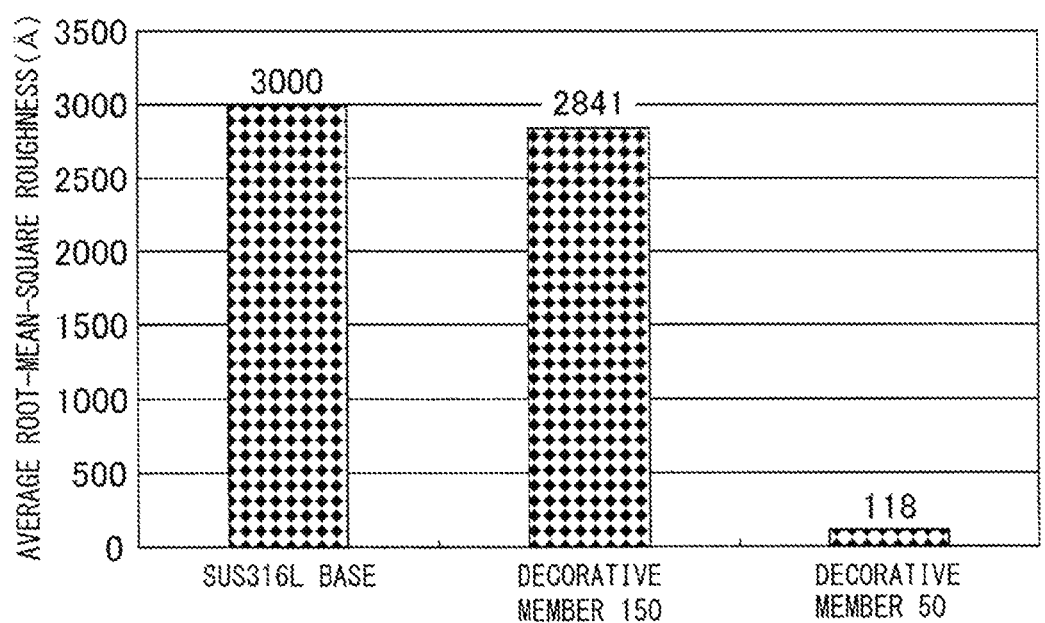
FIG. 16 represents the scratch resistances of the colored rigid decorative member and comparative materials of Example 4.
Figure 17:
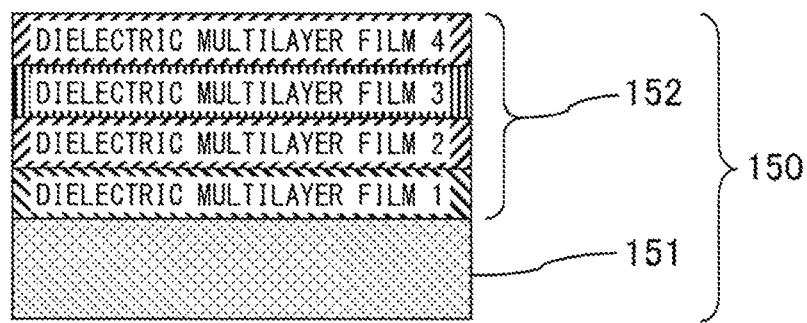
FIG. 17 illustrates a cross-sectional schematic view of a comparative material of Example 5.

FIG. 16 is a view representing the results of the measurement of scratch resistance performance in the colored rigid decorative member 50 of Example 4. The scratch resistances (average root-mean-square roughnesses) of the colored rigid decorative member 50 of Example 4 according to the present invention as well as a decorative member 150 produced by forming only a multi-layered dielectric film on an SUS316L material illustrated in FIG. 17 and specified by JIS, and an SUS316L base, on which no rigid film was formed, as comparative materials, were measured. It was confirmed from FIG. 16 that the colored rigid decorative member 50 of Example 4 of the present invention had far better scratch resistance performance than those of the SUS316L base, on which no rigid film was formed, and the decorative member 150.

Since the scratch resistance performance is determined generally by the product of the hardness of the abrasion-resistant layer, the film thickness of the abrasion-resistant layer, the degree of adhesion to the base, and the hardness of the base, a rigid member having high scratch resistance performance and having a red color can be formed by forming a dielectric film with high adhesion on an alloy film having high scratch resistance performance.

It is not necessary to make the dielectric films 56 exhibiting interference into a Si-based film. However, when the Si-based film is used, the formation of a $Si_3N_4$ film having high hardness on the outermost surface is more effective for improving scratch resistance performance.

Example 5

Figure 18:
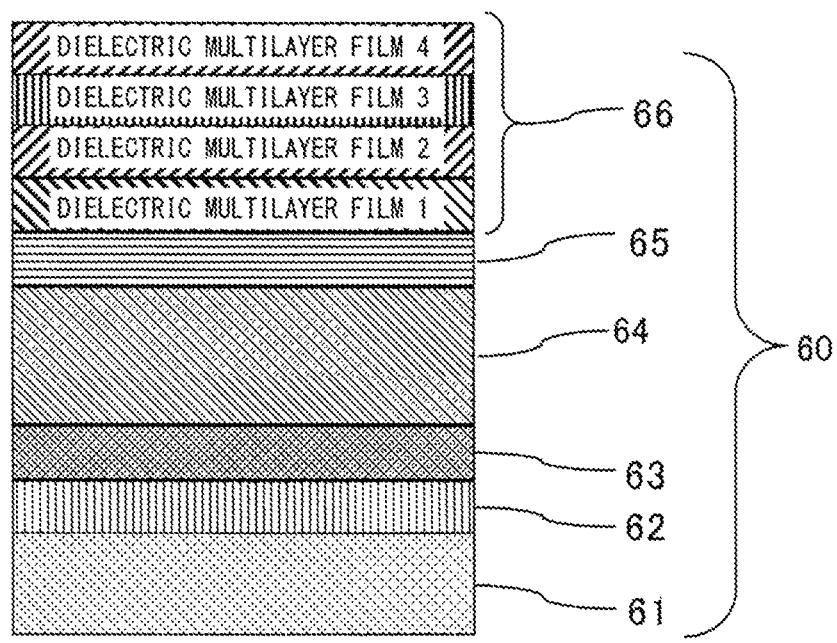
FIG. 18 illustrates a cross-sectional schematic view of a colored rigid decorative member of Example 5.

A sintered body of 45 wt % Mo and 55 wt % Nb and a metal Si target were used as sputtering targets in Example 5. As illustrated in FIG. 18, an SUS316L material specified by JIS was used as a base 61, and an adhesion layer 62 of 0.1 μm including a lower oxide of a MoNb alloy was formed on the base 61 by a sputtering method. Thereafter, a nitrogen gas was increased in a gradient manner while introducing the minute amount of oxygen gas, whereby a gradient adhesion layer 63 with a MoNb alloy oxynitride film of 0.2 μm was formed. Thereafter, a thin-film abrasion-resistant layer 64 including a MoNb alloy nitride film of 2.2 μm was formed. Thereafter, a nitrogen gas was decreased in a gradient manner, whereby a recolored gradient layer 65 with a MoNb alloy nitride film of 0.1 μm was formed. Thereafter, the sputtering of the MoNb alloy was stopped, the Si target was allowed to discharge electricity while introducing an argon gas, and a Si film of 0.03 μm, of which the film thickness was controlled, was formed. Thereafter, dielectric multilayer films 66 including three layers obtained by stacking, on the Si film, a $Si_3N_4$ film (thickness: 0.220 μm), a $SiO_2$ film (thickness: 0.01 μm), and a $Si_3N_4$ film (thickness: 0.12 μm) of which the film thicknesses were controlled were stacked and formed to produce a colored rigid decorative member 60. The appearance color of the colored rigid decorative member 60 obtained in the present Example 5 in Lab color space displaying exhibited L*: 63.11, a*: −12.61, and b*: −44.5, and the colored rigid decorative member 60 presented a vivid blue color.

Figure 19:
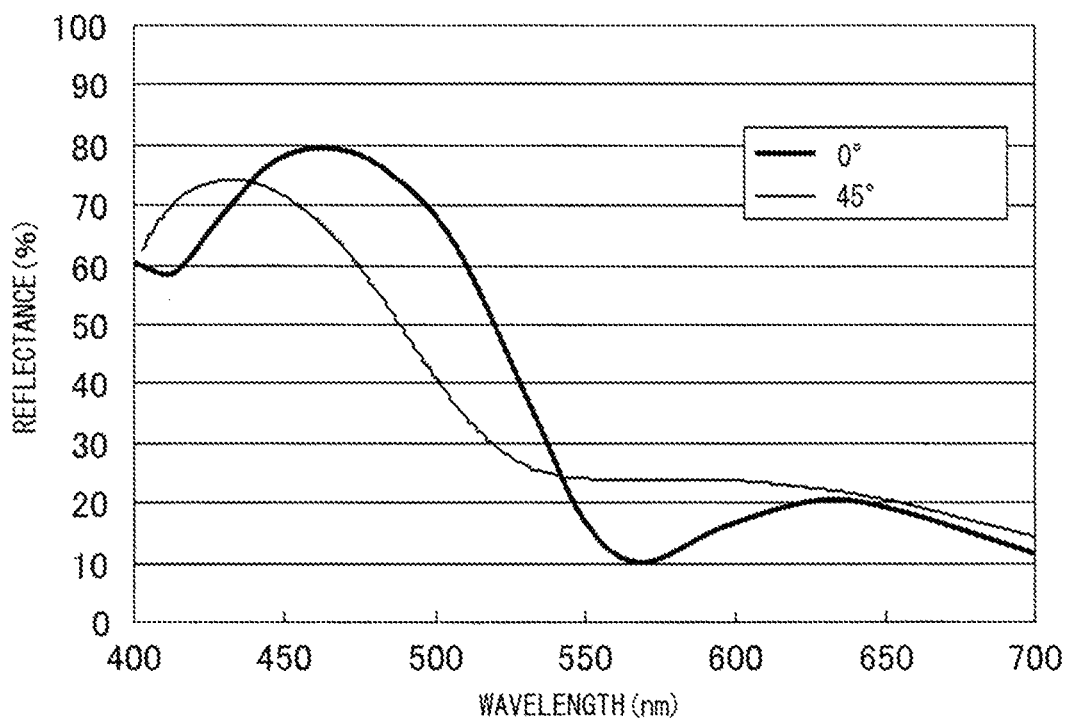
FIG. 19 represents the reflectance properties of the colored rigid decorative member of Example 5 according to an incidence angle.

FIG. 19 is a view representing the reflectance properties according to an incidence angle on the decorative member 60 of Example 5. It is found from FIG. 19 that the reflectance is high at a wavelength of 400 to 500 nm and the reflectance little varies depending on the variation of the incidence angle. The decorative member 60 of Example 5 has high color saturation and is brightly colored due to the stacking of the dielectric multilayer films 66, compared to the case of the formation with the single layer. Further, a color tone is changed depending on the incidence angle in the single layer, whereas the change of a color tone depending on the incidence angle can be inhibited by the stacking of the dielectric stacked films 66. Furthermore, the change of a color tone depending on the incidence angle can be allowed to be very small by putting a Si film having a high absorption coefficient into the dielectric stacked films 66.

Figure 20:
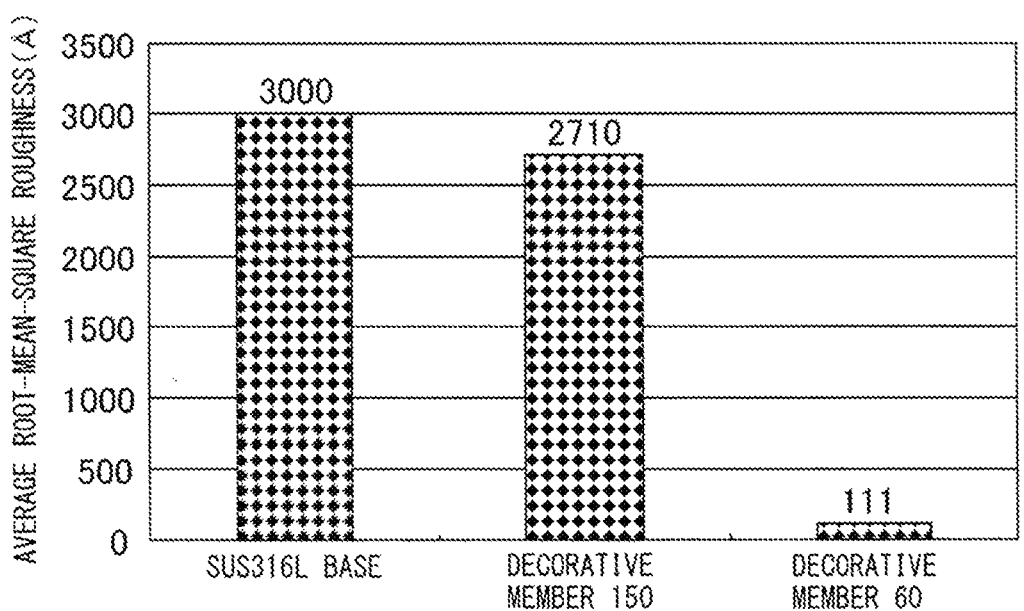
FIG. 20 represents the scratch resistances of a colored rigid decorative member and comparative materials of Example 6.

FIG. 20 is a view representing the results of the measurement of scratch resistance performance in the colored rigid decorative member 60 of Example 5. The scratch resistances (average root-mean-square roughnesses) of the colored rigid decorative member 60 of Example 5 according to the present invention as well as a decorative member 150 produced by forming only a dielectric multilayer film presenting a blue color on an SUS316L material illustrated in FIG. 17 and specified by JIS, and an SUS316L base, on which no rigid film was formed, as comparative materials, were measured. It was confirmed from FIG. 20 that the colored rigid decorative member 60 of Example 5 of the present invention had far better scratch resistance performance than those of the SUS316L base, on which no rigid film was formed, and the decorative member 150.

Since the scratch resistance performance is determined generally by the product of the hardness of the abrasion-resistant layer, the film thickness of the abrasion-resistant layer, the degree of adhesion to the base, and the hardness of the base, a rigid member having high scratch resistance performance and presenting a blue color can be formed by forming a dielectric film with high adhesion on an alloy film having high scratch resistance performance.

It is not necessary to make the dielectric films 66 exhibiting interference into a Si-based film. However, when the Si-based film is used, the formation of a $Si_3N_4$ film having high hardness on the outermost surface is more effective for scratch resistance performance.

Example 6

Figure 21:
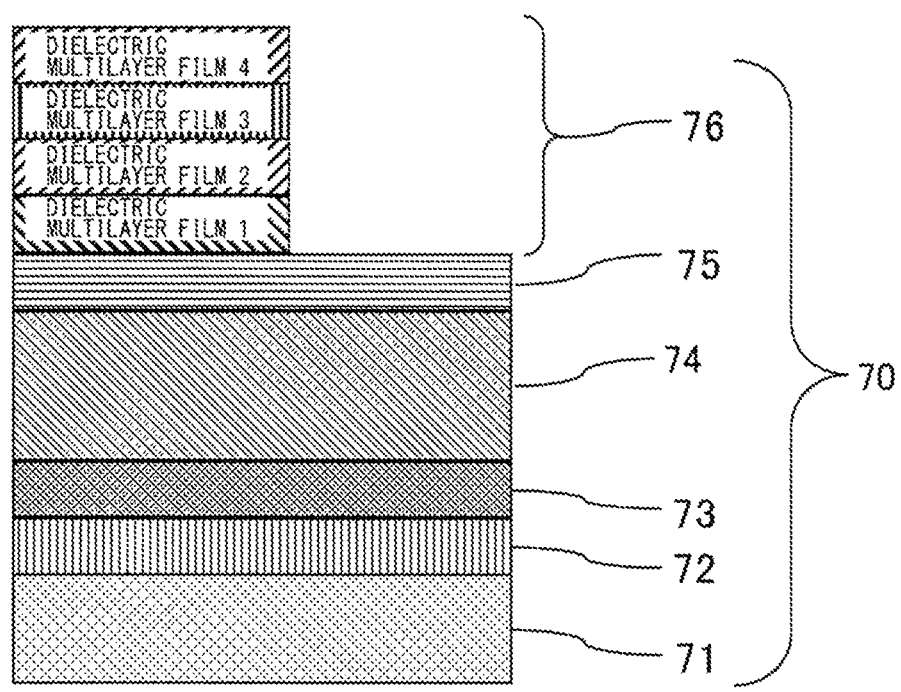
FIG. 21 illustrates a cross-sectional schematic view of the colored rigid decorative member of Example 6.

An SUS316L material specified by JIS was used as a base 71, and coating structures 71 to 76 similar to 61 to 66 illustrated in FIG. 18 of Example 5 were formed on the base 71. Then, a mask (not illustrated) was applied to a portion on the dielectric stacked films 76. Thereafter, a non-masked portion was peeled using hot phosphoric acid and an alkaline solvent, followed by removing the mask to thereby produce a colored rigid decorative member 70 illustrated in FIG. 21 and having a two-tone structure. As illustrated in FIG. 21, the surface of the colored rigid decorative member 70 has a structure in which the recolored gradient layer 75 and the dielectric film interference layers 76 coexist, and has two-tone colors of white and blue, and the rigid member having high decorativeness can be obtained.

As mentioned above, in the colored rigid decorative member of the present invention, adhesion between the base and the film is significantly improved, and scratch resistance is improved since the colored rigid decorative member includes, on the base, the alloy adhesion layer having a high adhesion effect, the alloy gradient adhesion layer of which the content of a reactant gas is increased in a gradient manner, the abrasion-resistant layer having high hardness, and the alloy recolored gradient layer of which the content of a reactant gas is decreased in a gradient manner, using a metal having the high effect of adhering to a metal and high brightness, and a metal having high film hardness and high corrosion resistance; scratch resistance can be further improved since the abrasion-resistant layer having high film hardness can be thickly formed; and the colored rigid decorative member having color variations and high decorativeness can be provided since a colored decoration unit film having a high quality feel is formed on the outermost layer.

INDUSTRIAL APPLICABILITY

Since the present invention can provide a colored rigid decorative member in which deterioration of appearance quality due to a flaw, abrasion, or the like is suppressed, and which has a color tone with a high quality feel and is rich in color variations, the present invention can be utilized in various decorative members for exterior parts of watches, personal ornaments such as glasses and accessories, decorative trim, sporting goods, and the like.

REFERENCE SIGNS LIST

10 Decorative member
11 Base
12 Adhesion layer
13 Gradient adhesion layer
14 Abrasion-resistant layer
15 Recolored gradient layer
16 Colored decorative layer
110 Decorative member
111 Base
112 Adhesion layer
113 Abrasion-resistant layer
114 Pt layer
120 Decorative member
121 Base
122 Pt layer
130 Decorative member
131 Base
132 Ti adhesion layer
133 TiN hardened layer
140 Decorative member
141 Base
142 Ti adhesion layer
143 Si adhesion layer
144 DLC layer
150 Decorative member
151 Base
152 Dielectric layer
20 Decorative member
21 Base
22 Adhesion layer
23 Gradient adhesion layer
24 Abrasion-resistant layer
25 Recolored gradient layer
26 Colored decorative layer
30 Decorative member
31 Base
32 Adhesion layer
33 Gradient adhesion layer
34 Abrasion-resistant layer
35 Recolored gradient layer
36 TiN layer
40 Decorative member
41 Base
42 Adhesion layer
43 Gradient adhesion layer
44 Abrasion-resistant layer
45 Recolored gradient layer
46 Ti adhesion layer
47 Si adhesion layer
48 DLC layer
50 Decorative member
51 Base
52 Adhesion layer
53 Gradient adhesion layer
54 Abrasion-resistant layer
55 Recolored gradient layer
56 Dielectric multilayer film layer
60 Decorative member
61 Base
62 Adhesion layer 63 Gradient adhesion layer
64 Abrasion-resistant layer
65 Recolored gradient layer
66 Dielectric layer multilayer film layer
70 Decorative member
71 Base
72 Adhesion layer
73 Gradient adhesion layer
74 Abrasion-resistant layer
75 Recolored gradient layer
76 Dielectric multilayer film layer (two-tone structure)

The invention claimed is:

1. A colored rigid decorative member comprising:
a base;
an adhesion layer, stacked on the base, comprising a lower oxide layer of an alloy in which a metal M1 and a metal M2, and, in addition, selectively a metal M3 are combined;
an inclined adhesion layer, stacked on the adhesion layer, comprising a reaction compound of an alloy in which a metal M4 and a metal M5, and, in addition, selectively a metal M6 are combined and of a non-metallic element selected from one or two or more of nitrogen, carbon, and oxygen;
an abrasion-resistant layer, stacked on the inclined adhesion layer, comprising a reaction compound of an alloy in which a metal M7 and a metal M8, and, in addition, selectively a metal M9 are combined and of a non-metallic element selected from one or two or more of nitrogen, carbon, and oxygen; a recolored inclined layer, stacked on the abrasion-resistant layer, comprising a reaction compound of an alloy in which a metal M10 and a metal M11, and, in addition, selectively a metal M12 are combined and of a non-metallic element selected from one or two or more of nitrogen, carbon, and oxygen; and
a colored decorative layer stacked on the recolored inclined layer, wherein
each of the metals M1, M4, M7, and M10 is selected from one or two of Mo and W;
each of the metals M2, M5, M8, and M11 is selected from one or two of Nb and Ta;
the metals M3, M6, M9, and M12 are selected from one or two or more of Cr, Ti, Hf, and Zr;
the content of a non-metallic element in a reaction compound included in the inclined adhesion layer is increased in an inclining manner in a thickness direction with departing from a substrate; and
the content of a non-metallic element in a reaction compound included in the recolored inclined layer is decreased in an inclining manner in a thickness direction with departing from the substrate.

2. The colored rigid decorative member according to claim 1, wherein
the colored decorative layer is a white noble metal film of Pt, Pd, or Rh; and
an intermetallic compound of a metal in the recolored inclined layer and the white noble metal is formed in a boundary between the colored decorative layer and the recolored inclined layer.

3. The colored rigid decorative member according to claim 1, wherein the colored decorative layer is a colored rigid film comprising a nitride, a carbide, a carbonitride, or a nitroxide of Ti, Zr, or Hf.

4. The colored rigid decorative member according to claim 1, wherein the colored decorative layer is a DLC (diamond-like carbon) rigid film.

5. The colored rigid decorative member according to claim 1, wherein the colored decorative layer is a dielectric layer obtained by forming a single- or multi-layered dielectric film.

6. The colored rigid decorative member according to claim 4, wherein a single- or multi-layered adhesion layer comprising Si or Ti is formed between the recolored inclined layer and the colored decorative layer.

7. The colored rigid decorative member according to claim 1, wherein the decorative film comprises a two-tone structure.

8. A method for producing a colored rigid decorative member, comprising:
a step of forming, on a base, an adhesion layer comprising a lower oxide layer of an alloy in which a metal M1 and a metal M2, and, in addition, selectively a metal M3 are combined;
a step of forming, on the adhesion layer, an inclined adhesion layer comprising a reaction compound of an alloy in which a metal M4 and a metal M5, and, in addition, selectively a metal M6 are combined and of a non-metallic element selected from one or two or more of nitrogen, carbon, and oxygen so that the content of a non-metallic element in a reaction mixture included in the inclined adhesion layer is increased in an inclining manner in a thickness direction with departing from a substrate;
a step of forming, on the inclined adhesion layer, an abrasion-resistant layer comprising a reaction compound of an alloy in which a metal M7 and a metal M8, and, in addition, selectively a metal M9 are combined and of a non-metallic element selected from one or two or more of nitrogen, carbon, and oxygen;
a step of forming, on the abrasion-resistant layer, a recolored inclined layer comprising a reaction compound of an alloy in which a metal M10 and a metal M11, and, in addition, a metal M12 are combined and of a non-metallic element selected from one or two or more of nitrogen, carbon, and oxygen so that the content of a non-metallic element in a reaction compound included in the recolored inclined layer is decreased in an inclining manner in a thickness direction with departing from the substrate; and
a step of stacking a colored decorative layer on the recolored inclined layer, wherein
each of the metals M1, M4, M7, and M10 is selected from one or two of Mo and W;
each of the metals M2, M5, M8, and M11 is selected from one or two of Nb and Ta; and
each of the metals M3, M6, M9, and M12 is selected from one or two or more of Cr, Ti, and Hf.

9. The method for producing a colored rigid decorative member according to claim 8, wherein at least one of the adhesion layer, the inclined adhesion layer, the abrasion-resistant layer, the recolored inclined layer, and the colored decorative layer is formed by a reactive sputtering method.

10. The method for producing a colored rigid decorative member according to claim 9, wherein
the inclined adhesion layer is formed by chronologically increasing or decreasing the amount of reactant gas containing the non-metallic element in a reactive sputtering method in the step of forming the inclined adhesion layer; and
the recolored inclined layer is formed by chronologically increasing or decreasing the amount of reactant gas containing the non-metallic element in a reactive sputtering method in the step of forming the recolored inclined layer.

11. The method for producing a colored rigid decorative member according to claim 8, further comprising a step of applying a mask to a portion of the colored decorative layer and peeling a non-masked portion of the colored decorative layer with an acid or an alkali, to thereby allow the colored decorative layer to comprise a two-tone structure.

* * * * *